(12) United States Patent
Horn et al.

(10) Patent No.: US 10,139,618 B2
(45) Date of Patent: Nov. 27, 2018

(54) MULTI-MIRROR ARRAY

(71) Applicant: Carl Zeiss SMT GmbH, Oberkochen (DE)

(72) Inventors: Jan Horn, Munich (DE); Stefan Tuerk, Endingen (DE); Oscar Noordman, Vught (NL); Ulrich Bihr, Kirchheim/Dirgenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/701,803

(22) Filed: Sep. 12, 2017

(65) Prior Publication Data
US 2018/0003951 A1    Jan. 4, 2018

Related U.S. Application Data

(63) Continuation of application No. PCT/EP2016/055621, filed on Mar. 16, 2016.

(30) Foreign Application Priority Data

Mar. 25, 2015  (DE) ........................ 10 2015 205 404

(51) Int. Cl.
  *G02B 26/08* (2006.01)
  *G03F 7/20* (2006.01)
  *H02K 41/035* (2006.01)
  *H02K 49/04* (2006.01)

(52) U.S. Cl.
  CPC ..... *G02B 26/0833* (2013.01); *G02B 26/0841* (2013.01); *G03F 7/702* (2013.01); *H02K 41/035* (2013.01); *H02K 49/04* (2013.01)

(58) Field of Classification Search
  CPC . G02B 26/0833; G02B 26/0841; G03F 7/702; G03F 7/70291
  See application file for complete search history.

(56) References Cited

U.S. PATENT DOCUMENTS

| 2003/0184844 A1* | 10/2003 | Yazdi ................. G02B 26/0841 359/298 |
| 2004/0179257 A1* | 9/2004 | Gurcan .............. G02B 26/0841 359/290 |
| 2005/0122558 A1* | 6/2005 | Ljungblad .......... G02B 26/0841 359/237 |
| 2006/0187517 A1 | 8/2006 | Ljungblad |
| 2007/0064298 A1 | 3/2007 | Chen |

(Continued)

FOREIGN PATENT DOCUMENTS

| DE | 10 2012 218 219 A1 | 4/2014 |
| DE | 10 2013 206 531 A1 | 5/2014 |

(Continued)

OTHER PUBLICATIONS

Swarthmore College, Switched Capacitor Circuits, Jan. 20, 2007, https://web.archive.org/web/20070120211619/http://www.swarthmore.edu/NatSci/echeevel/Ref/FilterBkgrnd/SwitchedCap.html, retieved via Wayback Machine on Feb. 28, 2018.*

(Continued)

*Primary Examiner* — Steven H Whitesell Gordon
(74) *Attorney, Agent, or Firm* — Fish & Richardson P.C.

(57) ABSTRACT

A multi-mirror array including displaceable mirror elements includes a passive electric damping mechanism for damping disturbances of the displacement positions of the mirror elements.

20 Claims, 5 Drawing Sheets

(56) References Cited

U.S. PATENT DOCUMENTS

| | | | |
|---|---|---|---|
| 2012/0044474 A1* | 2/2012 | Hauf | G02B 7/1815 355/67 |
| 2014/0327896 A1 | 11/2014 | Waldis et al. | |
| 2015/0185469 A1 | 7/2015 | Horn et al. | |
| 2016/0025952 A1 | 1/2016 | Horn et al. | |

FOREIGN PATENT DOCUMENTS

| | | |
|---|---|---|
| DE | 10 2013 203 035 A1 | 8/2014 |
| EP | 1 225 481 A2 | 7/2002 |
| WO | WO 03/079090 A1 | 9/2003 |
| WO | WO 2010/049076 A2 | 5/2010 |
| WO | WO 2013/120 926 A1 | 8/2013 |

OTHER PUBLICATIONS

Translation of International Search Report for corresponding Appl No. PCT/EP2016/055621, dated Jun. 15, 2016. (2 pages).

German Examination Report, with translation thereof, for corresponding DE Appl No. 10 2015 205 404.7, dated Feb. 5, 2016. (17 pages).

* cited by examiner

MULTI-MIRROR ARRAY

CROSS-REFERENCE TO RELATED APPLICATIONS

The present application is a continuation of, and claims benefit under 35 USC 120 to, international application PCT/EP2016/055621, filed Mar. 16, 2016, which claims benefit under 35 USC 119 of German Application No. DE 10 2015 205 404.7, filed Mar. 25, 2015. The entire disclosure of these applications are incorporated by reference herein.

FIELD

The disclosure relates to a multi-mirror array, in particular a multi-mirror array for an illumination optical unit of a projection exposure apparatus. The disclosure additionally relates to a facet mirror for an illumination optical unit of a projection exposure apparatus, an illumination optical unit for a projection exposure apparatus including such a facet mirror, an illumination system including such an illumination optical unit, and a projection exposure apparatus including such an illumination optical unit. In addition, the disclosure relates to a method for producing a microstructured or nanostructured component, and a component produced according to the method.

BACKGROUND

A multi-mirror array (MMA) for an illumination optical unit of a projection exposure apparatus is known for example from WO 2013/120926 A1. On account of low damping coefficients, the individual mirrors of such a multi-mirror array can be very sensitive with regard to disturbing excitations. DE 10 2013 203 035 A1 discloses a vibration-damping configuration of a damping section for damping vibrations of corresponding individual mirrors.

SUMMARY

The disclosure seeks to provide an improved a multi-mirror array.

In one aspect, the disclosure provides a multi-mirror array including a passive electrical damping mechanism for damping disturbances of the displacement positions of the mirror elements. The damping mechanisms are arranged in each case in a manner connected in series with one of the actuator electrodes, to which actuation signals can be applied for displacing the mirror elements. Individual parts of the damping mechanism can also be connected in parallel with the actuator electrodes at least momentarily.

According to the disclosure, it has been recognized that the stability of the positioning of the mirror elements can be considerably improved with the aid of such a passive damping mechanism. A passive damping mechanism can moreover be realized very simply. They are in particular significantly less complex than active damping systems. Furthermore, they are less susceptible to noise from the signal line. Finally, they can be integrated into a system particularly simply.

In this case, in contrast to active damping systems, a passive damping mechanism should be understood to mean a damping mechanism which do not have a measuring device for detecting the displacement position of the mirror elements or the time derivative thereof. The local electrical circuit, in particular, does not have such a measuring device. Such a measuring device can be provided at most as an external measuring device, that is to say as a separate component. However, the external measuring device is then used in particular for superordinate position regulation and not for damping.

The mirror elements are micromirrors, in particular. The mirror elements have in particular reflection areas in the range of 100 µm*100 µm to 10 mm*10 mm. The side length of the micromirrors is in particular at least 200 µm, in particular at least 300 µm, in particular at least 500 µm. It is in particular at most 5 mm, in particular at most 3 mm, in particular at most 2 mm, in particular at most 1 mm.

The mirror elements are EUV mirrors, in particular, that is to say mirrors for reflecting illumination radiation in the EUV range, in particular in the range of 5 nm to 30 nm, in particular in the range of 5 nm to 13.5 nm.

The multi-mirror array is embodied in particular as a microelectromechanical system (MEMS).

The actuators for displacing the mirror elements are in particular electrical actuators, in particular electrostatic actuators.

In accordance with a further aspect of the disclosure, a damping mechanism is assigned to at least one of the actuator electrodes for each degree of freedom of displacement of each of the mirror elements. It is possible, in particular, to assign a damping mechanism to each of the actuator electrodes.

In accordance with a further aspect of the disclosure, the damping mechanism are arranged in each case between an actuator amplifier and one of the actuator electrodes. They are arranged in particular in the signal line from a control device for controlling the displacement of the mirror elements. They can form part of such a signal line.

In accordance with a further aspect of the disclosure, the damping mechanism are embodied in each case as an energy dissipation device. They are embodied in particular in each case as a resistance device.

According to the disclosure, it has been recognized that a damping of the mirror elements can be achieved by such a dissipation of energy.

In accordance with a further aspect of the disclosure, the damping mechanism include at least one mechanism selected from the group of series resistors, antiparallel-connected diodes, switched capacitor structures and transistor circuits. In this case, the last three alternatives mentioned, antiparallel-connected diodes, switched capacitor structures and transistor circuits, have the advantage that they can be realized with a significantly smaller structural space than series resistors.

According to the disclosure, it has been recognized that a suitable effective series resistance can be realized by each of these mechanisms. Details of the different alternatives will become apparent from the description of the corresponding exemplary embodiments.

In accordance with one aspect of the disclosure, all damping mechanisms of the multi-mirror array are embodied correspondingly. It is possible, in particular, for all damping mechanisms of the multi-mirror array to be embodied identically. As an alternative thereto, a combination of different damping mechanisms selected from the abovementioned group of damping mechanisms is possible.

In accordance with a further aspect of the disclosure, the damping mechanisms are variably adjustable. They have in particular an adjustable resistance. An adjustability of the damping mechanism, in particular an adaptation to the frequencies to be damped of the individual mirrors, is made possible as a result.

In accordance with a further aspect of the disclosure, the damping mechanisms are embodied in each case as on-ASIC structures (structures on an ASIC, application specific integrated circuit). A particularly simple integration into the control electronics for controlling the actuation of the mirror elements is made possible as a result.

In accordance with a further aspect of the disclosure, the damping mechanisms are embodied in each case as structures having an area of at most 10%, in particular at most 5%, in particular at most 3%, in particular at most 2%, in particular at most 1%, in particular at most 0.5%, in particular at most 0.3%, in particular at most 0.2%, in particular at most 0.1%, of the reflection area of the associated mirror element. The area for forming the structures on the ASIC is also referred to as the footprint. The footprint of the structures serving as a damping mechanism is in particular at most $10^5$ μm$^2$, in particular at most $5*10^4$ μm$^2$, in particular at most $3*10^4$ μm$^2$, in particular at most $2*10^4$ μm$^2$, in particular at most $1*10^4$ μm$^2$, in particular at most $5*10^3$ μm$^2$, in particular at most $3*10^3$ μm$^2$, in particular at most $2*10^3$ μm$^2$, in particular at most $1.8*10^3$ μm$^2$, in particular at most $1.5*10^3$ μm$^2$. This constitutes a considerable reduction of the area relative to a damping mechanism known hitherto, in particular relative to ohmic series resistors.

In accordance with a further aspect of the disclosure, the damping mechanisms have in each case an effective series resistance in the range of 1 MΩ to 100 GΩ. The effective series resistance of the damping mechanism is preferably at least 5 MΩ, in particular at least 10 MΩ, in particular at least 20 MΩ. The effective series resistance of the damping mechanism is in particular at most 10 GΩ, in particular at most 1 GΩ, in particular at most 100 MΩ.

It was possible to show that an efficient damping of disturbances of the displacement positions of the mirror elements could be achieved with such resistance values.

In accordance with a further aspect of the disclosure, the multi-mirror array is embodied in a modular fashion. The multi-mirror array is embodied in a modular fashion in particular in such a way that a total reflection area can be extended substantially arbitrarily by an arrangement of a plurality of such multi-mirror arrays.

As a result of the modular embodiment of the multi-mirror array, the flexibility thereof, in particular, is increased.

Further aspects of the disclosure are to improve a facet mirror for an illumination optical unit of a projection exposure apparatus, such an illumination optical unit, an illumination system including such an illumination optical unit, and a projection exposure apparatus.

These aspects are achieved using the corresponding structures which each include at least one multi-mirror array in accordance with the description above. The advantages are evident from those of the multi-mirror array.

Further aspects of the disclosure are to improve a method for producing a microstructured or nanostructured component and also such a component.

These aspects are achieved by the provision of a projection exposure apparatus including at least one multi-mirror array in accordance with the preceding description. The advantages are evident, once again, from those of the multi-mirror array.

BRIEF DESCRIPTION OF THE DRAWINGS

Further advantages and details of the disclosure are evident from the description of a plurality of exemplary embodiments with reference to the drawings, in which.

DETAILED DESCRIPTION

First of all, the basic construction of a projection exposure apparatus 1 is described below on the basis of the figures. The description of the basic construction of the projection exposure apparatus 1 should be understood to be exemplary. Alternative embodiments are possible.

Figure 1:
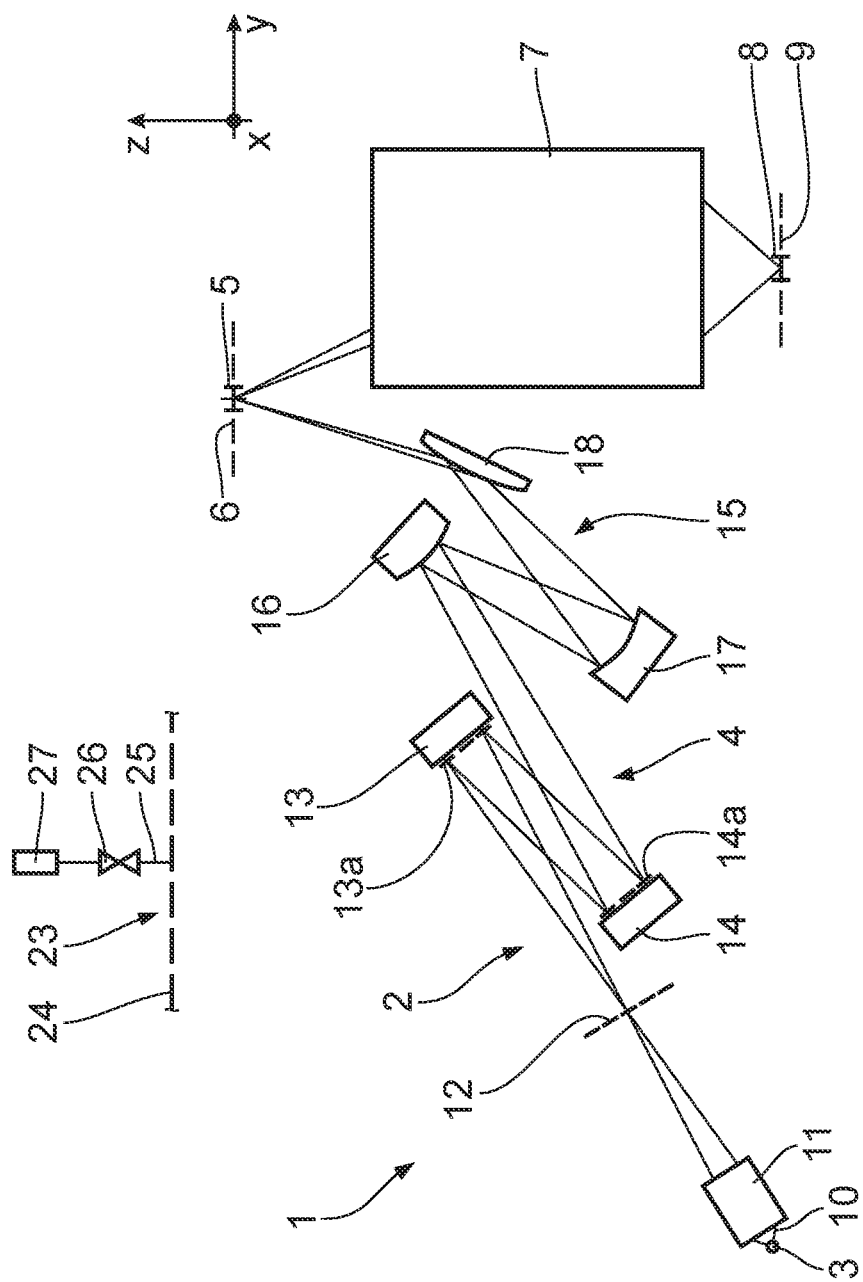
FIG. 1 schematically shows a projection exposure apparatus for microlithography, with an illumination system and a projection optical unit in meridional section.

FIG. 1 schematically shows a projection exposure apparatus 1 for microlithography in a meridional section. An illumination system 2 of the projection exposure apparatus 1 has, besides a radiation source 3, an illumination optical unit 4 for the exposure of an object field 5 in an object plane 6. The object field 5 can be shaped in a rectangular fashion or in an arcuate fashion with an x/y aspect ratio of 13/1, for example. In this case, a reflective reticle (not illustrated in FIG. 1) arranged in the object field 5 is exposed, the reticle bearing a structure to be projected by the projection exposure apparatus 1 for the production of microstructured or nanostructured semiconductor components. A projection optical unit 7 serves for imaging the object field 5 into an image field 8 in an image plane 9. The structure on the reticle is imaged onto a light-sensitive layer of a wafer, which is not illustrated in the drawing and is arranged in the region of the image field 8 in the image plane 9.

The reticle, which is held by a reticle holder (not illustrated), and the wafer, which is held by a wafer holder (not illustrated), are scanned synchronously in the y-direction during the operation of the projection exposure apparatus 1. Depending on the imaging scale of the projection optical unit 7, it is also possible for the reticle to be scanned in the opposite direction relative to the wafer.

With the aid of the projection exposure apparatus 1, at least one part of the reticle is imaged onto a region of a light-sensitive layer on the wafer for the lithographic production of a microstructured or nanostructured component, in particular of a semiconductor component, for example of a microchip. Depending on the embodiment of the projection exposure apparatus 1 as a scanner or as a stepper, the reticle and the wafer are moved in a temporally synchronized manner in the y-direction continuously in scanner operation or step by step in stepper operation.

The radiation source 3 is an EUV radiation source having an emitted used radiation in the range of between 5 nm and 30 nm. This can be a plasma source, for example a GDPP (Gas Discharge Produced Plasma) source or an LPP (Laser Produced Plasma) source. Other EUV radiation sources, for example those based on a synchrotron or on a free electron laser (FEL), are also possible.

EUV radiation 10 emerging from the radiation source 3 is focused by a collector 11. A corresponding collector is known for example from EP 1 225 481 A. Downstream of the collector 11, the EUV radiation 10 propagates through an intermediate focal plane 12 before being incident on a field facet mirror 13 with a multiplicity of field facets 13a. The field facet mirror 13 is arranged in a plane of the illumination optical unit 4 which is optically conjugate with respect to the object plane 6.

The EUV radiation 10 is also referred to hereinafter as used radiation, illumination light or as imaging light.

Downstream of the field facet mirror 13, the EUV radiation 10 is reflected by a pupil facet mirror 14 with a multiplicity of pupil facets 14a. The pupil facet mirror 14 lies either in the entrance pupil plane of the illumination optical unit 7 or in an optically conjugate plane with respect thereto. The field facet mirror 13 and the pupil facet mirror 14 are constructed from a multiplicity of individual mirrors, which will be described in even greater detail below. In this case, the subdivision of the field facet mirror 13 into individual mirrors can be such that each of the field facets 13a which illuminate the entire object field 5 by themselves is represented by exactly one of the individual mirrors. Alternatively, it is possible to construct at least some or all of the field facets 13a using a plurality of such individual mirrors. The same correspondingly applies to the configuration of the pupil facets 14a of the pupil facet mirror 14, which are respectively assigned to the field facets 13a and which can be formed in each case by a single individual mirror or by a plurality of such individual mirrors.

The EUV radiation 10 is incident on the two facet mirrors 13, 14 at an angle of incidence that is less than or equal to 25°, measured in relation to the normal to the mirror surface. The EUV radiation 10 therefore impinges on the two facet mirrors 13, 14 in the range of normal incidence operation. Impingement with grazing incidence is also possible. The pupil facet mirror 14 is arranged in a plane of the illumination optical unit 4 which constitutes a pupil plane of the projection optical unit 7 or is optically conjugate with respect to a pupil plane of the projection optical unit 7. With the aid of the pupil facet mirror 14 and an imaging optical assembly in the form of a transfer optical unit 15 having mirrors 16, 17 and 18 designated in the order of the beam path for the EUV radiation 10, the field facets of the field facet mirror 13 are imaged into the object field 5 in a manner being superimposed on one another. The last mirror 18 of the transfer optical unit 15 is a mirror for grazing incidence ("grazing incidence mirror"). The transfer optical unit 15 together with the pupil facet mirror 14 is also referred to as a sequential optical unit for transfer-ring the EUV radiation 10 from the field facet mirror 13 toward the object field 5. The illumination light 10 is guided from the radiation source 3 toward the object field 5 via a plurality of illumination channels. Each of these illumination channels is assigned a field facet 13a of the field facet mirror 13 and a pupil facet 14a of the pupil facet mirror 14, the pupil facet being disposed downstream of the field facet. The individual mirrors of the field facet mirror 13 and of the pupil facet mirror 14 can be tiltable by an actuator system, such that a change in the assignment of the pupil facets 14a to the field facets 13a and correspondingly a changed configuration of the illumination channels can be achieved. This results in different illumination settings, which differ in the distribution of the illumination angles of the illumination light 10 over the object field 5.

In order to facilitate the explanation of positional relationships, use is made below of, inter alfa, a global Cartesian xyz-coordinate system. The x-axis runs perpendicular to the plane of the drawing toward the observer in FIG. 1. The y-axis runs toward the right in FIG. 1. The z-axis runs upward in FIG. 1.

In selected figures from among the subsequent figures, a local Cartesian xyz-coordinate system is depicted, wherein the x-axis runs parallel to the x-axis according to FIG. 1 and the y-axis together with the x-axis spans the optical area of the respective optical element. The field facet mirror 13 is embodied as a micromirror array (MMA). It forms one example of a multi-mirror array. It forms in particular an optical assembly for guiding the used radiation 10, i.e. the EUV irradiation beam. The field facet mirror 13 is embodied as a microelectromechanical system (MEMS). It has a multiplicity of individual mirrors arranged in a matrix-like manner in rows and columns in an array. In the following text, the individual mirrors are also referred to as mirror elements 19. The mirror elements 19 are designed to be tiltable by an actuator system, as will be explained below. Overall, the field facet mirror 13 has approximately 100 000 of the mirror elements 19. Depending on the size of the mirror elements 19, the field facet mirror 13 can also have for example approximately 1000, 10 000 or else hundreds of thousands of mirror elements 19, for example 200 000, 300 000 or 500 000.

The mirror elements 19 are embodied as micromirrors. They each have a reflection area 20 having dimensions in the micrometers range or millimeters range. The reflection area 20 is embodied such that it is in particular polygonal, in particular triangular, quadrilateral or hexagonal. It is preferably embodied in such a way that it forms a tile element that can be used to tile a plane. It is preferably embodied in a square fashion. It preferably has a side length that is in the range of 100 μm to 10 mm. The side length of the reflection area 20 is in particular at least 200 μm, in particular at least 300 μm, in particular at least 500 μm. It is in particular at most 5 mm, in particular at most 3 mm, in particular at most 2 mm, in particular at most 1 mm.

The reflection area 20 includes a multilayer coating for optimizing the reflectivity thereof at the wavelength of the used radiation 10.

As is indicated schematically in FIG. 1, the illumination optical unit 4 is arranged in an evacuable chamber 23. FIG. 1 only schematically indicates a boundary wall 24 of the evacuable chamber 23. The chamber 23 communicates with a vacuum pump 27 via a fluid line 25, in which a shutoff valve 26 is accommodated. The operating pressure in the evacuable chamber 23 is a few Pa (partial pressure of $H_2$). All other partial pressures are significantly below $10^{-7}$ mbar. The mirror elements 19 are arranged in a substrate 21. The latter is mechanically connected to the mirror elements 19 by way of a thermal conduction portion 22. An articulation body 28 which permits a tilt of the mirror element 19 relative to the substrate 21 is part of the thermal conduction portion 22. The articulation body 28 can be embodied as a flexure which permits a tilt of the mirror element 19 about defined tilt axes, for example about one or two tilt axes, which, in particular, are arranged perpendicular to one another.

The multi-mirror array 19 is pivotable in particular about a tilt angle in the range of at least ±50 mrad, in particular at least ±80 mrad, in particular at least ±100 mrad. Here, the respective tilt position can be maintained with an accuracy of at least 0.2 mrad, in particular at least 0.1 mrad, in particular at least 0.05 mrad. For further details of the mirror element 19, in particular its geometrical embodiment and mechanical mounting, reference should be made to WO 2013/120926 A1, which is hereby fully incorporated in the present application. Merely schematically, attention should be drawn to an actuator pin 29, which is mechanically connected to the mirror body 32 via a holding body 30 and a spacer 31. In this case, the holding body 30 forms the connection of the mirror element 19 to the articulation body 28.

The substrate 21 forms a sleeve surrounding the actuator pin 29. A total of four actuator electrodes 33 are integrated in each case in the sleeve. The actuator electrodes 33 are arranged opposite one another respectively in pairs. They constitute counterelectrodes with respect to the actuator pin 29, embodied as an electrode pin. In principle, it is also possible to provide a different number of actuator electrodes 33 per actuator pin 29. It is possible to provide, in particular, in each case at least two actuator electrodes 33 per degree of freedom of displacement. By generating a potential difference between one or a plurality of the actuator electrodes 33 or between actuator electrode 33 and actuator pin 29, it is possible to generate an electrostatic force on the actuator pin 29 which can lead to a deflection of the mirror element 19.

For further details in particular of the arrangement of the mirror elements 19 in the substrate 21 and the pivotability thereof via the actuators and also the embodiment of the articulation bodies and the thermal conduction portions 22, reference should be made moreover to WO 2010/049076 A2.

The mirror elements 19 are arranged on a substrate-like carrying structure 34. The carrying structure 34 is arranged on the rear side of the mirror elements 19. A multiplicity of signal lines 36 are integrated into the carrying structure 34. In the figures, for clarification, the signal lines 36 are illustrated schematically in the manner of an electrical circuit diagram, rather than in a manner corresponding to their actual arrangement in the carrying structure 34. This likewise applies to a driver stage 37 of a displacement device for displacing the mirror elements 19. The driver stages 37 can likewise be integrated into the carrying structure 34. The driver stages 37 can likewise be embodied as an ASIC. The driver stages 37 are supplied with actuation signals via signal lines 38, which are likewise only illustrated schematically. For structural details of the arrangement of the signal lines 38 in the carrying structure 34, reference should again be made to WO 2013/120926 A1. The actuator electrodes 33 can in particular also be embodied as comb electrodes or can include comb electrodes. In this case, preferably on the actuator pin 29 and/or on the mirror body 32, provision is made of comb structures corresponding thereto. For further details of the embodiment of the actuator electrodes 33 as comb electrodes, reference should be made to DE 10 2013 206 531 A1, which is hereby incorporated in the present application as part thereof.

In particular, control electronics for controlling the displacement of the mirror elements 19 are integrated into the carrying structure 34. The control electronics can also be arranged on the carrying structure 34. The control electronics are embodied in particular as an application specific integrated circuit 35 (ASIC). The arrangement of the ASIC 35 as illustrated in the figures serves merely for fundamental explanation. It does not necessarily correspond to the actual arrangement. The ASICs 35 can in particular be encapsulated, that is to say arranged on or in the carrying structure 34 in a manner sealed in a liquid-tight, in particular gas-tight, fashion. This is advantageous for the application in a vacuum environment.

Further aspects of the multi-mirror array including a multiplicity of the mirror elements 19 are described below with reference to FIGS. 2 to 7.

As already described, the illumination optical unit 4 is arranged in the evacuable chamber 23. The mirror elements 19 are arranged in particular in an environment at a very low pressure. This leads to an extremely low damping coefficient, which in particular has the effect that the mirror elements 19 react very sensitively to mechanical disturbances, in particular at resonant frequencies. According to the disclosure, therefore, provision is made of a damping mechanism 39 for damping disturbances of the displacement positions of the mirror elements 19. Passive electrical damping mechanisms, in particular, serve as damping mechanism 39. The damping mechanisms 39 include in particular exclusively passive damping mechanisms. In the case of the alternative illustrated in FIG. 2, the damping mechanism 39 include in each case a series resistor 40. The series resistor 40 is connected in series in each case with one of the actuator electrodes 33. It leads to a dissipation of energy during oscillations of the corresponding mirror element 19.

The different alternatives respectively with regard to the displacement of the mirror element 19 in a displacement direction are described below. In one preferred embodiment, each pair of the actuator electrodes 33, in particular each of the actuator electrodes 33, is provided with a corresponding damping mechanism 39. The damping mechanism 39 can be embodied in each case identically in particular for the individual actuator electrodes 33. It is also possible to provide different actuator electrodes from among the actuator electrodes 33 with different damping mechanisms 39. A targeted adaptation of the damping mechanisms 39 to possibly different details of the actuator electrodes 33 is possible as a result.

The concept of the arrangement of a passive electrical damping mechanism 39, as provided according to the disclosure, can be applied or adapted in principle to any, in particular to any electrostatic, actuator embodiments.

Figure 2:
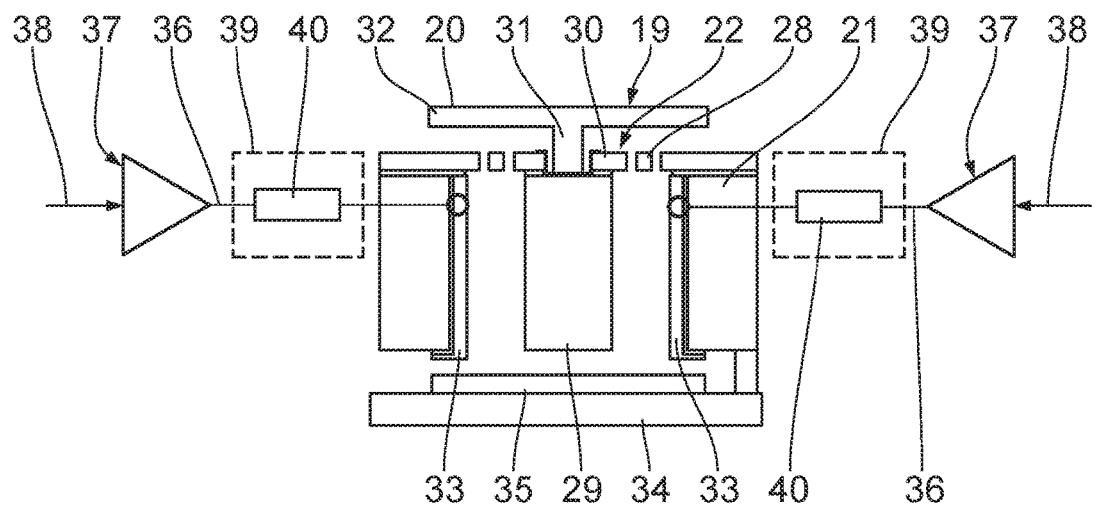
FIG. 2 shows a schematic illustration of an individual mirror element of a multi-mirror array including a damping mechanism in the form of a series resistor.
Figure 3:
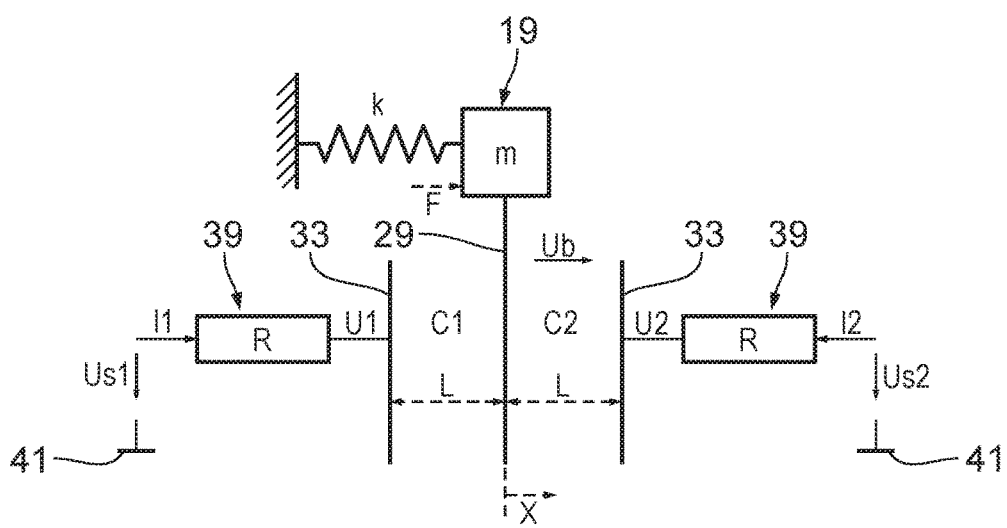
FIG. 3 shows a schematic illustration of a model for describing the electromechanical system of the mirror element in accordance with FIG. 2.

FIG. 3 schematically illustrates an electromechanical model of the mirror element 19 in accordance with FIG. 2. Instead of a tilting movement, a translation is considered for simplification. The following designations are used in the model in accordance with FIG. 3:

m: mass of the mirror element 19
k: stiffness of the suspension of the mirror element 19, in particular stiffness of the articulation body 28,
F: force acting on the mirror element 19 externally
C1, C2: capacitances between the actuator electrodes 33 and the actuator pin 29
x: deflection of the mirror element relative to a specific operating point
Ub: bias voltage at the actuator pin 29
U1, U2: voltages applied to the actuator electrodes 33
Us1, Us2: actuation voltages (output voltage of the amplifiers)
$Us_{10}$, $Us_{20}$: operating point of the output voltage of the amplifiers
I1, I2: current of the actuation signals
R: effective ohmic resistance of the damping mechanism 39
L: distance between the actuator pin 29 and the actuator electrodes 33 at the operating point.

In order to analyze the dynamic behavior of the mirror element 19, a system equation was derived and linearized at the operating point. The system equation can be represented in a general form as follows:

$$y^{\cdot}=Ay+Bu,$$

where A denotes the system matrix and u denotes the external inputs to the mirror element, in particular external mechanical forces and actuation voltages.

The damping in this system can be derived by way of the eigen values of the system matrix A. The damping coefficient, in particular, can be derived from the real and imaginary parts of the eigen values.

Conversely, for given capacitances, capacitance gradients, mass m and stiffness k, it is possible to derive what value for the resistance R is used to obtain a specific damping.

The relationship between the damping and the resistance R was examined for one exemplary, realistic design of the mirror elements 19. The result is illustrated by way of example in FIG. 4. The following values were taken as a basis here: Ub=−100 V, L=50 μm, area A of the actuator electrodes 33: A=1.6*10$^{-7}$ m$^2$, mass m=1.2*10$^{-7}$ kg, stiffness k=0.7 N/m.

Figure 4:
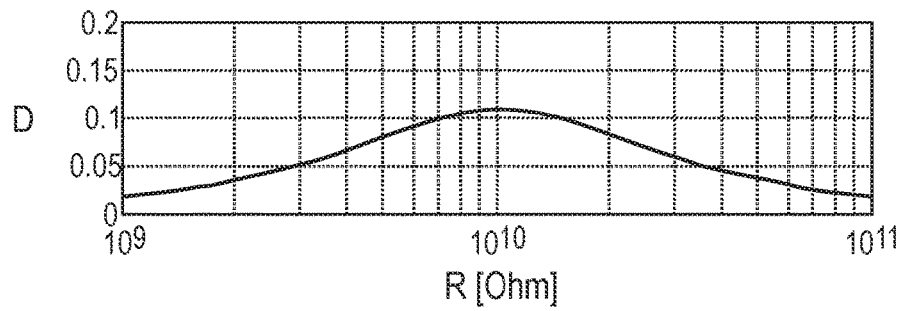
FIG. 4 shows an exemplary illustration of the dependence of the damping coefficient on the value of the series resistor from the model in accordance with FIG. 3.

As is evident from FIG. 4, for the specified values of the parameters of the electromechanical system, a resistance R of the order of magnitude of GΩ is used to achieve a damping of at least 0.01.

As was found contrary to initial expectations in the context of initial investigations, however, a damping of approximately 0.001 already suffices for the applications envisaged here. Such a value of the damping can be achieved for MEMS micromirrors with resistances R in the megohm range, in particular in the range of less than 100 MΩ, for example with a resistance in the range of 10 MΩ to 20 MΩ.

A resistance R in the range of 10 MΩ to 100 MΩ, in particular less than 50 MΩ, in particular of less than 30 MΩ, in particular of approximately 20 MΩ, has the advantage that the leakage currents always present in the MEMS component do not lead to undesirably high voltage drops across the series resistor 40. The voltage drop across the series resistor 40 is in particular at most 10%, in particular at most 5%, in particular at most 3%, in particular at most 2%, in particular at most 1%, of the actuator voltage at which the full displacement scope of the mirror element 19 is achieved.

Furthermore, it should be noted that FIG. 4 illustrates the relations in a specific set-up with actuator electrodes 33 in accordance with the embodiment illustrated in FIG. 2. For comb electrodes having a higher capacitance and higher capacitance gradients, a good damping can already be achieved with lower resistances.

An alternative embodiment of the multi-mirror array including damping mechanism 39 is described below with reference to FIG. 5. Identical parts acquire the same reference signs as in the case of the above-described exemplary embodiment, to the description of which reference is hereby made.

The series resistors 40 are embodied as on-ASIC structures, that is to say as structures on the application specific circuit. They can be embodied as an N-well (N+Poly) resistor in the embodiment according to FIG. 2. Such resistors can be produced with up to 5 kΩ/sq. Therefore, 4000 squares are used for a 20 MΩ resistor. The series resistor 40 can be embodied in particular as a meandering structure. It can be accommodated on an area of 16 000 μm$^2$.

Four series resistors 40 are provided in the case of differential and two-axis driving of the mirror element 19.

Figure 5:
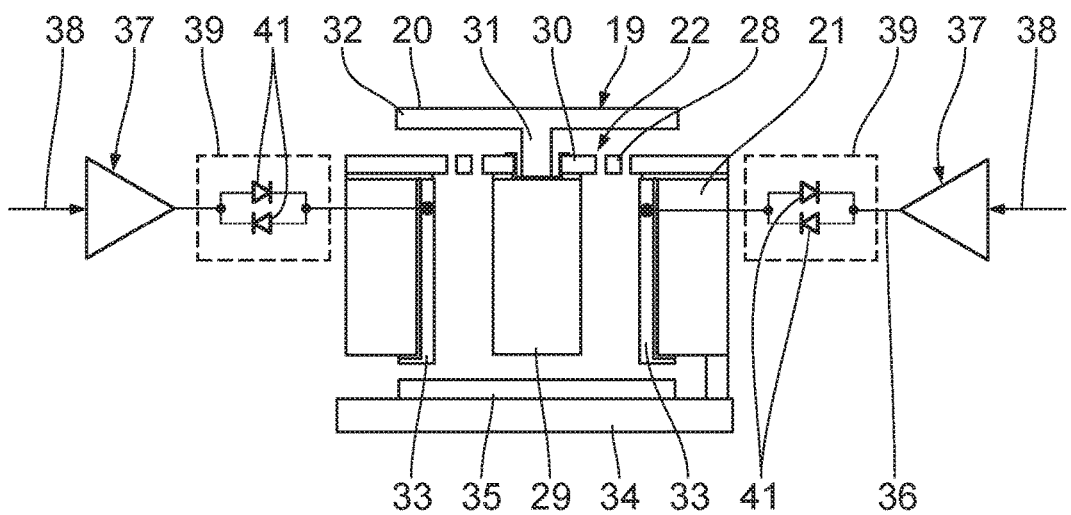
FIG. 5 shows an illustration in accordance with FIG. 2 of an embodiment in which the damping mechanism is realized by antiparallel-connected diodes.

In the exemplary embodiment illustrated in FIG. 5, the damping mechanisms 39 include in each case two antiparallel-connected diodes 41 instead of the series resistor 40. The diodes 41 have a low saturation reverse current. The saturation reverse current can be in particular in the range of 1 pA to 100 pA, in particular in the range of 3 pA to 30 pA, in particular in the range of 5 pA to 20 pA. Components for example having a characteristic similar to those of Fairchild FJH1100 components can be used as diodes 41.

The diodes 41 preferably have a very high differential resistance, at least in specific current/voltage operating ranges. The differential resistance (reciprocal of the conductance) can be around 4.2 GΩ for example in the region of the current zero crossing. This is the value of the Fairchild FJH1100 component mentioned above.

The diodes 41 can lead to a nonlinear damping effect. At the current zero crossings or around the current zero crossings such as occur in the case of undesired vibrations of the mirror element 19, however, the diode 41 has a sufficiently high differential resistance. It has been found that the arrangement according to the disclosure of two antiparallel-connected diodes 41 can be sufficient for the damping of the mirror element 19.

The diodes 41 are embodied as on-ASIC structures. They are embodied in particular in each case as structures having a size of approximately 30 μm*30 μm. The leakage current of such a structure is approximately 10 pA.

A further alternative of the multi-mirror array including a passive damping mechanism 39 is described below with reference to FIG. 6. Identical parts are given the same reference signs as in the case of the exemplary embodiments described above, to which reference is hereby made.

Figure 6:
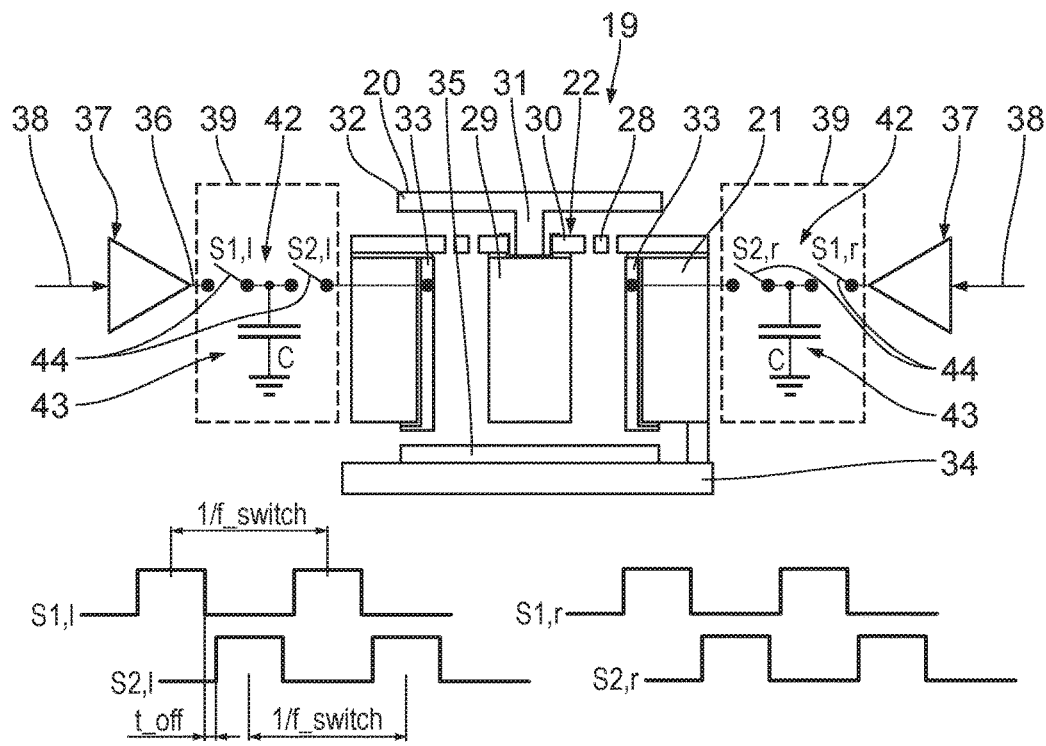
FIG. 6 shows an illustration corresponding to FIG. 2 of a further exemplary embodiment, in which the damping mechanism is realized as a switched capacitor structure.

In the exemplary embodiment in accordance with FIG. 6, the damping mechanisms 39 include in each case a so-called switched capacitor structure (switched capacitor resistor). Such a structure behaves and acts like a resistor between the connection locations A and B. Such a structure can be embodied particularly simply as an on-ASIC structure. It has a very accurately adjustable resistance. The resistance can be fine tuned in particular by way of the switching frequency. Such a structure has very high thermal stability. Moreover, such a structure has the advantage that capacitances can be realized very accurately as on-ASIC structures.

The switched capacitor structure 42 illustrated in FIG. 6 includes in each case one capacitor 43 and two switches 44.

A switching scheme for the switches 44 of the two switched capacitor structures 42 is illustrated by way of example in FIG. 6, lower part. The upper positions of the curve here mean in each case that the corresponding switch 44 is closed. The dead time (t_off), during which both switches 44 of the switched capacitor structure 42 are open, is not illustrated in a manner true to scale. The dead time is usually significantly shorter than is illustrated in FIG. 6. With the switching scheme illustrated, the switched capacitor structure 42 behaves like a resistor.

The switching frequency of the switched capacitor structure 42 is at least 2 decades above the first tilting resonance of the mirror element 19. The latter is usually in the range of 100 Hz to 1000 Hz, in particular in the range of 300 Hz to 600 Hz. The switching frequency of the switched capacitor structure 42 can be in particular above 100 kHz. It is in particular in the range of 10 kHz to 10 MHz.

The capacitance C of the capacitor 43 is in particular in the femtofarad or picofarad range. It can be in particular in the range of 100 fF to 5 pF, in particular in the range of 200 fF to 3 pF, in particular in the range of 300 fF to 2 pF, in particular at least 500 fF, in particular at most 1 pF. An on-ASIC area of approximately 500 µm² is used for the capacitor 43. The area used for the switches 44 is in a similar range. The total area used for the switched capacitor structure 42 is therefore approximately 1500 µm².

The switched capacitor structure 42 has a particularly small area (small footprint). It additionally has the advantage that it has no or at least no pronounced nonlinearity.

Individual parts of the damping mechanisms can also be connected in parallel with the actuator electrodes at least momentarily. This can be discerned for example in FIG. 6. The damping mechanisms 39 connected in series with the actuator overall contains a capacitor 43 as part of a switched capacitor unit. In accordance with FIG. 6, the capacitor 43 is momentarily connected to ground (GND). If, for example, the actuator pin 29 is likewise connected to ground (GND), with the switch S2 (FIG. 6, 42) momentarily closed, this results in a momentary parallel connection of the capacitor 43 to the actuator or to the actuator capacitance. The entire damping mechanism 39, with regard to its efficacy, can furthermore be regarded as a series connection with the actuator.

Figure 7:
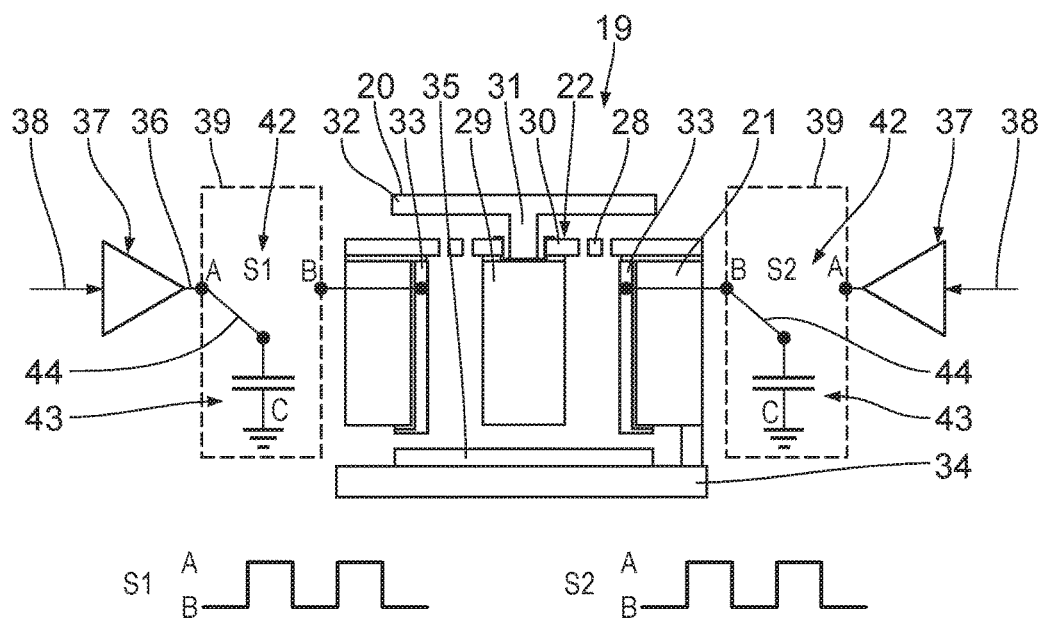
FIG. 7 shows an illustration corresponding to FIG. 6 with an alternative switched capacitor structure.

FIG. 7 illustrates one variant of embodiment illustrated in FIG. 6. In this variant, the switched capacitor structure 42 includes, besides the capacitor 43, in each case only a single switch 44. The switch 44 is switchable back and forth between the two connection locations A and B. This alternative has a particularly simple design, in particular a design which can be realized particularly simply.

The damping mechanism 39 can also have a different embodiment. It is possible, in particular, to form the resistors of the damping mechanism 39 with transistors 45, for example by the gate G being connected to a fixed voltage below the threshold voltage. A corresponding variant is illustrated schematically in FIG. 8.

Figure 8:
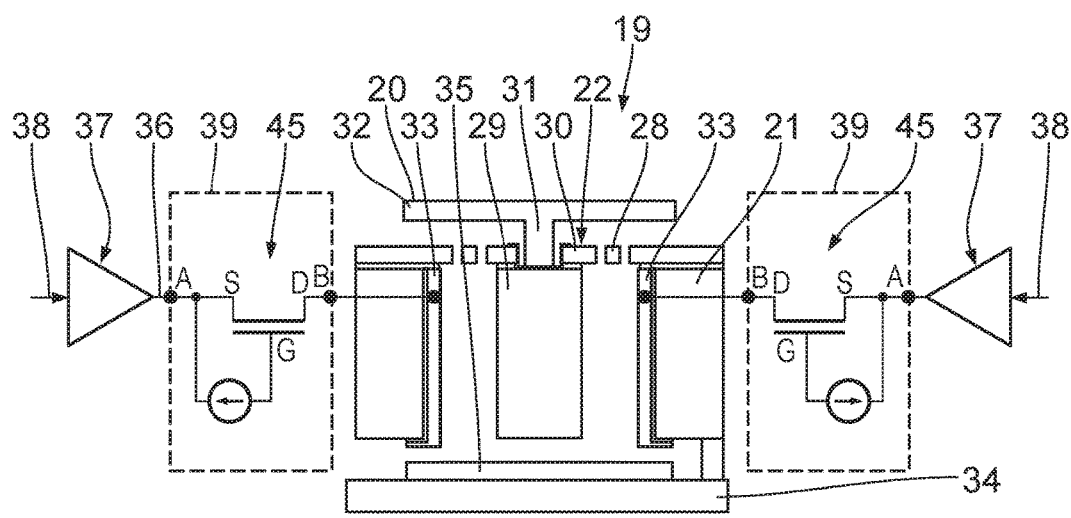
FIG. 8 shows an illustration corresponding to FIG. 2 of a further exemplary embodiment, in which the damping mechanism is realized by a transistor circuit.

In the variant illustrated in FIG. 8, the source (S) is arranged in each case on the side facing the driver stage 37. The drain (D) is arranged on the side facing the actuator electrode 31. Depending on what kind of transistor type is provided for the transistor 45, drain and source may need to be interchanged. This may be the case, for example, if use is made of a transistor type which has a greatly asymmetrical current-voltage behavior between drain and source.

Depending on the type of transistor 45, provision can also be made for the damping mechanism 39 to be formed in each case by two transistors 45, in order to obtain a resistor having a similar resistance value in both directions.

In accordance with one alternative, provision can also be made for directly connecting gate and source to one another, that is to say short-circuiting them. The gate-source voltage is then equal to 0. The resistance would then be precisely equal to the resistance of the transistor 45 in the switched-off state.

As an alternative thereto, a fixed gate potential relative to ground (GND) can also be provided. The gate-source voltage is then no longer constant owing to the fluctuation of the driving voltage (at the points A in the circuit diagram in accordance with FIG. 8). It has been found that the resulting drain-source resistances of the transistors 45 can nevertheless contribute to the damping.

In accordance with a further alternative, provision is made for connecting in series in each case a plurality of transistors 45 having a fixed gate-source voltage. The damping mechanism 39 can be formed in particular by a series connection of a plurality of transistors 45 having fixed gate-source voltages.

Even with resistors formed by transistors, the desired resistance value of 20 MΩ for example, can readily be realized.

In accordance with further alternatives, a low-pass filter, in particular an analog low-pass filter, is in each case provided in the actuator path, that is to say in the signal line 36, between the driver stage 37 and the actuator electrodes 33. The low-pass filter preferably has a cut-off frequency of approximately 1000 Hz. It has a damping of at least 25 dB starting from a frequency of 10 kHz. A corresponding filter can be provided in all of the alternatives described above.

What is claimed is:
1. A multi-mirror array, comprising:
 a multiplicity of displaceable mirror elements, each mirror element comprising a reflection area;
 a multiplicity of actuators configured to displace the mirror elements; and
 a multiplicity of passive electrical damping mechanisms configured to damp disturbances of displacement positions of the mirror elements,
wherein:
 to displace one of the mirror elements, each actuator comprises an actuator electrode configured so that an actuation signal can be applied thereto via a signal line;
 each damping mechanism is connected in series with an actuator electrode;
 the damping mechanisms comprise at least mechanism selected from the group consisting of antiparallel-connected diodes, switched capacitor structures and transistor circuits; and
 at least one of the following conditions holds:
  i) each damping mechanism comprises structures having an area of at most 10% of the reflection area of the associated mirror element;
  ii) the multi-mirror array further comprises a low-pass filter having a cut-off frequency of 1000 Hz and a damping of at least 25 dB starting from a frequency of 10 kHz in an actuator path; and
  iii) the damping mechanisms are variably adjustable, and each damping mechanism comprises structures having an area of at most 10% of the reflection area of the associated mirror element;
  iv) the multi-mirror array further comprises a low-pass filter having a cut-off frequency of 1000 Hz and a damping of at least 25 dB starting from a frequency of 10 kHz in an actuator path, wherein the damping mechanisms are variably adjustable; and
  v) the multi-mirror array further comprises a low-pass filter having a cut-off frequency of 1000 Hz and a damping of at least 25 dB starting from a frequency of 10 kHz in an actuator path, wherein each damping mechanism comprises on-ASIC structures.

2. The multi-mirror array of claim 1, wherein each damping mechanism comprises an energy dissipation device.

3. The multi-mirror array of claim 1, wherein the damping mechanisms are variably adjustable.

4. The multi-mirror array of claim 1, wherein each damping mechanism comprises on-ASIC structures.

5. The multi-mirror array of claim 1, wherein each damping mechanism comprises structures having an area of at most 10% of the reflection area of the associated mirror element.

6. The multi-mirror array of claim 1, wherein each damping mechanism has an effective series resistance in the range of from 1 MΩ to 100 GΩ.

7. The multi-mirror array of claim 1, wherein the damping mechanisms comprise a switched capacitor structure having a switching frequency in the range of from 10 kHz to 10 MHz.

8. The multi-mirror array of claim 1, further comprising a low-pass filter having a cut-off frequency of 1000 Hz and a damping of at least 25 dB starting from a frequency of 10 kHz in an actuator path.

9. The multi-mirror array of claim 1, wherein the damping mechanisms are variably adjustable, and each damping mechanism comprises on-ASIC structures.

10. The multi-mirror array of claim 1, wherein the damping mechanisms are variably adjustable, and each damping mechanism comprises structures having an area of at most 10% of the reflection area of the associated mirror element.

11. The multi-mirror array of claim 1, wherein the damping mechanisms are variably adjustable, and each damping mechanism has an effective series resistance in the range of from 1 MΩ to 100 GΩ.

12. The multi-mirror array of claim 1, wherein the damping mechanisms are variably adjustable, and the damping mechanisms comprise a switched capacitor structure having a switching frequency in the range of from 10 kHz to 10 MHz.

13. The multi-mirror array of claim 1, further comprising a low-pass filter having a cut-off frequency of 1000 Hz and a damping of at least 25 dB starting from a frequency of 10 kHz in an actuator path, wherein the damping mechanisms are variably adjustable.

14. The multi-mirror array of claim 1, further comprising a low-pass filter having a cut-off frequency of 1000 Hz and a damping of at least 25 dB starting from a frequency of 10 kHz in an actuator path, wherein each damping mechanism comprises on-ASIC structures.

15. A mirror, comprising:
a multi-mirror array according to claim 1,
wherein the mirror is a facet mirror.

16. An optical unit, comprising:
a multi-mirror array according to claim 1,
wherein the illumination optical unit is a illumination optical unit.

17. A system, comprising:
an illumination optical unit, comprising a multi-mirror array according to claim 1; and
a radiation source configured to generate illumination radiation
wherein the system is an illumination system.

18. An apparatus, comprising:
an illumination system, comprising:
an illumination optical unit, comprising a multi-mirror array according to claim 1; and
a radiation source configured to generate illumination radiation,
wherein the apparatus is a microlithography projection exposure apparatus.

19. The microlithography projection exposure apparatus of claim 18, further comprising a projection optical unit.

20. A method of using a microlithography projection exposure apparatus comprising an illumination optical unit and a projection optical unit, the method comprising:
using the illumination optical unit to illuminate structures of a reticle; and
using the projection optical unit to image the illuminated structures of the reticle onto a light-sensitive material,
wherein the illumination optical unit comprises a multi-mirror array according to claim 1.

* * * * *

UNITED STATES PATENT AND TRADEMARK OFFICE
CERTIFICATE OF CORRECTION

PATENT NO. : 10,139,618 B2
APPLICATION NO. : 15/701803
DATED : November 27, 2018
INVENTOR(S) : Jan Horn et al.

Page 1 of 1

It is certified that error appears in the above-identified patent and that said Letters Patent is hereby corrected as shown below:

In the Specification

Column 5, Line 55, delete "transfer-ring" and insert -- transferring --.

Column 6, Line 5, delete "alfa," and insert -- alia, --.

Signed and Sealed this
Ninth Day of April, 2019

Andrei Iancu
*Director of the United States Patent and Trademark Office*